US012563713B2

(12) United States Patent
Chen et al.

(10) Patent No.: US 12,563,713 B2
(45) Date of Patent: Feb. 24, 2026

(54) MEMORY DEVICE WITH JOGGED BACKSIDE METAL LINES

(71) Applicant: Taiwan Semiconductor Manufacturing Company, Ltd., Hsin-Chu (TW)

(72) Inventors: Jui-Lin Chen, Taipei (TW); Kian-Long Lim, Hsinchu (TW); Feng-Ming Chang, Hsinchu County (TW); Yi-Feng Ting, Taipei (TW); Hsin-Wen Su, Hsinchu (TW); Lien-Jung Hung, Taipei (TW); Ping-Wei Wang, Hsin-Chu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 683 days.

(21) Appl. No.: 17/890,762

(22) Filed: Aug. 18, 2022

(65) Prior Publication Data

US 2024/0064950 A1 Feb. 22, 2024

(51) Int. Cl.
H10B 10/00 (2023.01)

(52) U.S. Cl.
CPC .................................... H10B 10/12 (2023.02)

(58) Field of Classification Search
CPC ......... H10B 10/00; H10B 10/12; H10B 10/18
See application file for complete search history.

(56) References Cited

U.S. PATENT DOCUMENTS

| | | | |
|---|---|---|---|
| 11,121,078 B2 | 9/2021 | Chen et al. | |
| 2001/0017419 A1 | 8/2001 | Lee | |
| 2012/0120703 A1* | 5/2012 | Chang ................... | G11C 11/412 365/51 |
| 2016/0190141 A1* | 6/2016 | Lee .................... | H10D 30/6211 257/390 |

FOREIGN PATENT DOCUMENTS

| | | |
|---|---|---|
| CN | 110504285 A | 11/2019 |
| EP | 3096325 A1 | 11/2016 |
| TW | 202205287 A | 2/2022 |

* cited by examiner

*Primary Examiner* — Jesse Y Miyoshi
(74) *Attorney, Agent, or Firm* — HAYNES AND BOONE, LLP

(57) ABSTRACT

A semiconductor device includes a first source/drain feature on a front side of a substrate. The device includes a first backside metal line under the first source/drain feature and extending lengthwise along a first direction. The device includes a first backside via disposed between the first source/drain feature and the first backside metal line. The first backside metal line is a first bit line of a first static random access memory (SRAM) cell and is connected to the first source/drain feature through the first backside via. The first backside metal line includes a first portion and a second portion each extending widthwise along a second direction perpendicular to the first direction, the first portion is wider than the second portion, and the first portion partially lands on the first backside via. The first and the second portions are substantially aligned on one side along the first direction.

20 Claims, 9 Drawing Sheets

MEMORY DEVICE WITH JOGGED BACKSIDE METAL LINES

BACKGROUND

In deep sub-micron integrated circuit technology, embedded static random access memory (SRAM) devices have become a popular storage unit for high speed communication, image processing, and system-on-chip (SOC) products. The amount of embedded SRAM in microprocessors and SOCs increases to meet the performance requirement in each new technology generation. As silicon technology continues to scale from one generation to the next, parasitic effects may be impacting SRAM device performance more and more. For example, parasitic resistance and parasitic capacitance may become greater factors as semiconductor feature sizes continue to shrink. These parasitic effects may degrade the minimum operating voltage (Vmin) and the speed of an SRAM cell, which may lead to sub-par SRAM performance or even device failures.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
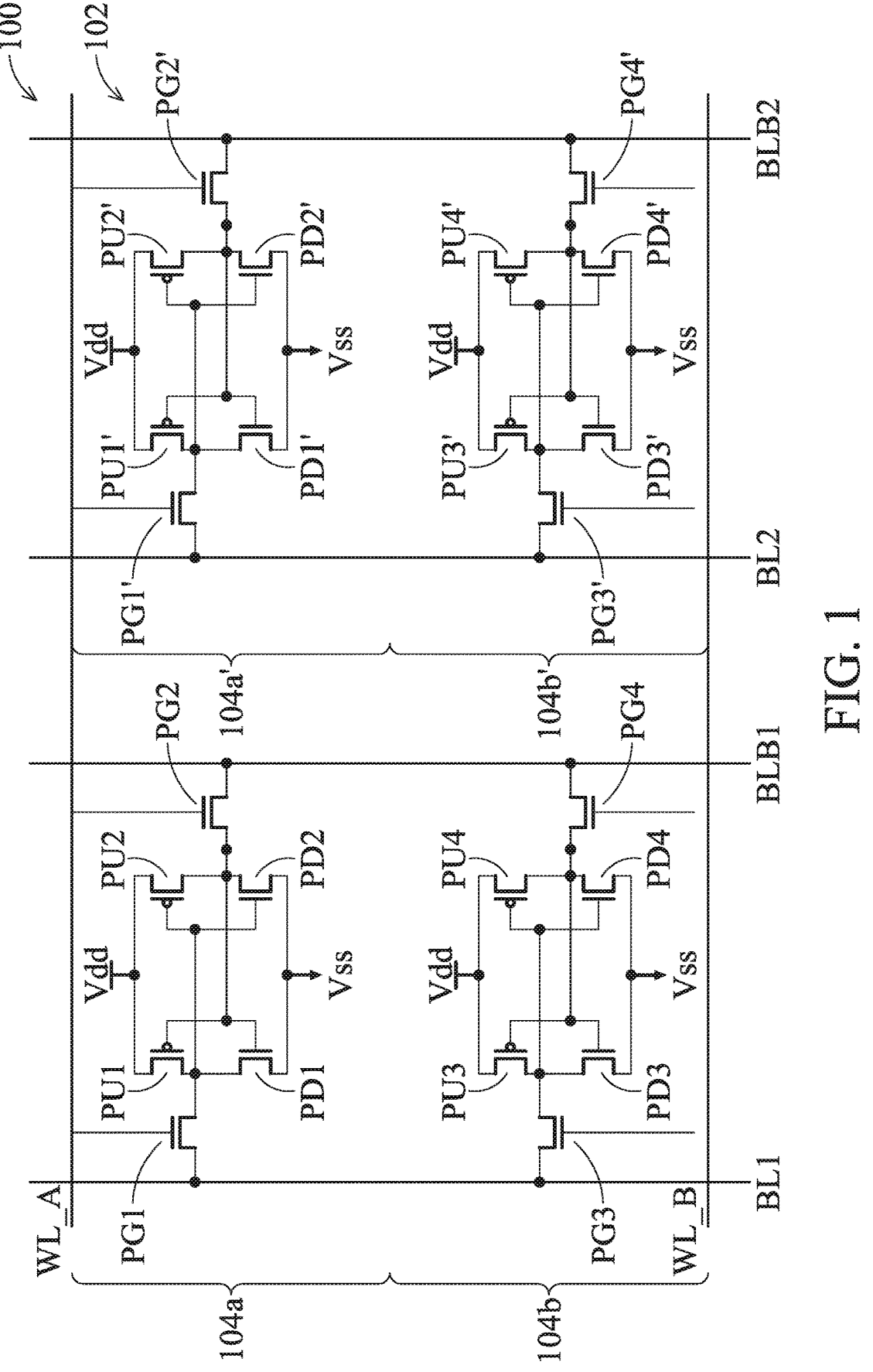
FIG. 1 illustrates a circuit diagram of a semiconductor device having an SRAM array according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure relates to semiconductor devices having optimized metal line routing. Particularly, the present disclosure is directed to semiconductor devices having static random access memory (SRAM) cells where the SRAM cells have backside signal lines with jog offsets and partial landing on backside vias. An SRAM cell (or device) is a type of semiconductor memory that uses bi-stable latching circuitry (e.g., flip-flop) to store binary bits of information. A semiconductor device may include an SRAM array comprising a plurality of SRAM cells, each cell having a plurality of metal routing lines including signal lines such as bit lines and bit line bars (which are the logical opposite of bit lines). However, as device footprint continues to scale down, the spacing between metal lines becomes constrained, thereby adversely affecting device performance. For example, if metal lines for the bit lines are too close to each other, the increased parasitic capacitance will degrade the speed of the device. And if the dimensions of the metal lines are reduced to decrease capacitance, there would be increased resistance, which would also degrade device operation. The present disclosure presents a new metal line routing scheme to alleviate the spacing and metal line dimension issues described above. Specifically, the bit lines and bit line bars are moved to the backside of the semiconductor device. These signal lines have metal landing offsets and jog offsets that increase a spacing between adjacent metal lines while retaining sufficient metal volume. These signal lines may be adjacent bit lines or bit line bars between adjacent SRAM cells. This means that the coupling capacitance is reduced while resistance is not adversely affected, thereby increasing SRAM speed and performance.

Embodiments of the present disclosure can be implemented with planar, FinFET, or gate-all-around (GAA)

transistors. GAA transistors refer to transistors having gate stacks (gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein.

FIG. 1 illustrates a circuit diagram of a semiconductor device 100 having an SRAM array 102 according to an embodiment of the present disclosure. The SRAM array 102 includes four SRAM cells 104a, 104a', 104b, and 104b'. Each of the four SRAM cells is formed of six transistors (two pull-down transistors, two pull-up transistors, and two pass-gate transistors). Each SRAM cell stores a bit of memory through the pull-down and pull-up transistors, and the SRAM cells are addressed by word lines and bit lines through the pass-gate transistors.

The SRAM cell 104a includes pull-up transistors PU1 and PU2, pull-down transistors PD1 and PD2, and pass gate transistors PG1 and PG2. The sources of PU1 and PU2 are coupled together and connected to high voltage Vdd. The sources of PD1 and PD2 are coupled together and connected to low source voltage Vss or ground. The gates of PU1 and PD1 are coupled together and connected to the common drains of PU2, PD2 and PG2. The gates of PU2 and PD2 are coupled together and connected to the common drains of PU1, PD1, and PG1. PU1, PU2, PD1, and PD2 form a first set of cross coupled inverters to store a data bit. The source of PG1 is connected to a first bit line BL1 and the source of PG2 is connected to a first bit line bar BLB1. The gates of PG1 and PG2 are connected to a first word line WL_A.

The SRAM cell 104b includes pull-up transistors PU3 and PU4, pull-down transistors PD3 and PD4, and pass gate transistors PG3 and PG4. The sources of PU3 and PU4 are coupled together and connected to high voltage Vdd. The sources of PD3 and PD4 are coupled together and connected to low voltage Vss or ground. The gates of PU3 and PD3 are coupled together and connected to the common drains of PU4, PD4 and PG4. The gates of PU4 and PD4 are coupled together and connected to the common drains of PU3, PD3, and PG3. PU3, PU4, PD3, and PD4 form a second set of cross coupled inverters to store a data bit. The source of PG3 is connected to the same first bit line BL1 and the source of PG4 is connected to the same first bit line bar BLB1. The gates of PG3 and PG4 are connected to a second word line WL_B.

The SRAM cells 104a' and 104b' are configured similarly to the respective SRAM cells 104a and 104b. The SRAM cells 104a' includes pull-up transistors PU1' and PU2', pull-down transistors PD1' and PD2', and pass gate transistors PG1' and PG2'. The SRAM cell 104b' includes pull-up transistors PU3' and PU4', pull-down transistors PD3' and PD4', and pass gate transistors PG3' and PG4'. For the sake of brevity, similar configurations and connections will not be repeated. The SRAM cells 104a' and 104b' include a third and fourth set of cross coupled inverters that each store a data bit. The sources of PG1' and PG3' are connected to a second bit line BL2. The sources of PG2' and PG4' are connected to a second bit line bar BLB2. The SRAM cell 104a' share the same first word line WL_A with the SRAM cell 104a, and the SRAM cell 104b' share the same second word line WL_B with the SRAM cell 104b. That is, the gates of the pass-gate transistors PG1' and PG2' also connect to the first word line WL_A, and the gates of the pass-gate transistors PG3' and PG4' also connect to the second word line WL_B.

Figure 2:
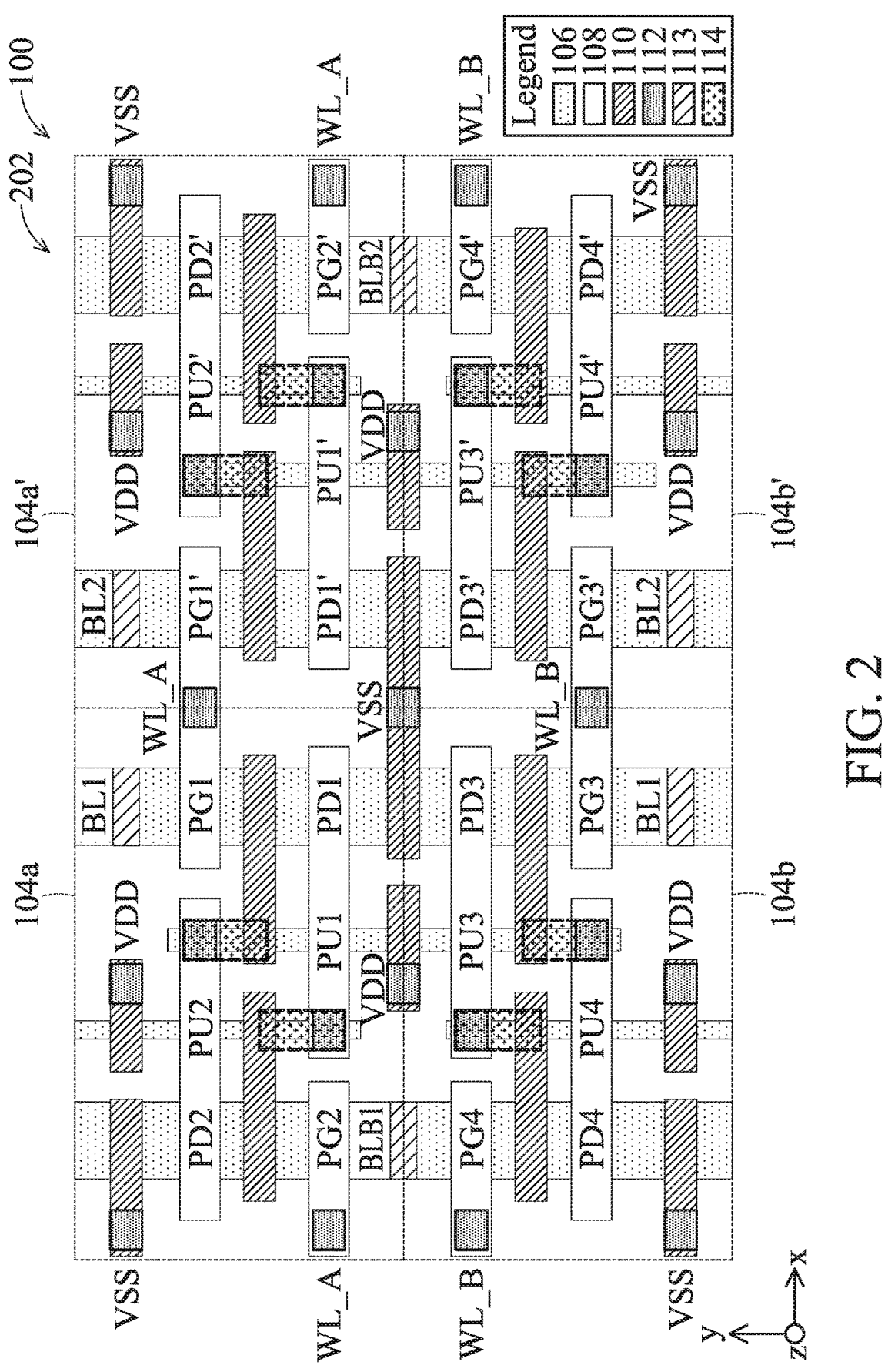
FIG. 2 illustrates a top view device layout of the semiconductor device in FIG. 1 according to an embodiment of the present disclosure.

FIG. 2 illustrates a top view device layout 202 of the SRAM array 102 according to an embodiment of the present disclosure. The device layout 202 includes the SRAM cells 104a, 104a', 104b, and 104b' defined by the dashed line cell boundaries. The SRAM cells 104a and 104a' are adjacent to each other in the x direction and mirror each other across a vertical cell boundary between them. The SRAM cells 104b and 104b' are adjacent to each other in the x direction and mirror each other across a vertical cell boundary between them. The SRAM cells 104a and 104b are adjacent to each other in the y direction and mirror each other across a horizontal cell boundary between them. The SRAM cells 104a' and 104b' are adjacent to each other in the y direction and mirror each other across a horizontal cell boundary between them.

FIG. 2 shows where each of the transistors PU1, PU1', PU2, PU2', PU3, PU3', PU4, PU4', PD1, PD1', PD2, PD2', PD3, PD3', PD4, PD4', PG1, PG1', PG2, PG2', PG3, PG3', PG4, and PG4' are located (labeled on the gate of each transistor). How each transistor is connected to each other has already been described with respect to FIG. 1 and will not be repeated here for the sake of brevity.

The device layout 202 includes several active regions 106 extending in the y direction on a front side of a substrate. The active regions 106 may be configured for planar, fin, or gate-all-around semiconductor structures. Some of the active regions 106 may extend lengthwise across the horizontal cell boundaries so that the same active region is shared across SRAM cells. Several gates 108 are disposed over the active regions 106. The gates 108 extend lengthwise in the x direction. Some of the gates 108 may extend across the vertical cell boundaries to span across active regions of different SRAM cells. Several source/drain (S/D) contacts 110 are disposed over S/D regions of the active regions 106, some of which may couple S/D regions of different transistors together. S/D region(s) may refer to a source or a drain, individually or collectively dependent upon the context. Several frontside vias 112 and backside vias 113 are each coupled to one of the gates 108, the active regions 106, or the S/D contacts 110. These vias 112 and 113 allow the gates 108, the active regions 106, or the S/D contacts 110 to electrically couple to a higher or lower material layer in the z direction. In FIG. 2, each via 112 and 113 is labeled with the name of the node for which the respective via is a part thereof. For example, frontside vias 112 as part of the first word line WL_A are labeled with "WL_A" to their sides. In an embodiment, frontside vias 112 as part of WL_A, WL_B, VSS, and VDD are located on a frontside of the semiconductor device 100, and backside vias 113 as part of BL1, BL2, BLB1, and BLB2 are located on a backside of the semiconductor device 100.

There are also eight gate-to-drain contacts 114 that couple gates 108 to S/D contacts 110. The gate-to-drain contacts 114 are also referred to as butted contacts. In an embodiment, the interconnection between the drain (or source) to the gate is achieved by a local interconnect (LI) technology. For example, the local interconnect is formed using the gate electrode material, such as polysilicon, metal, or other conductive material used in gate electrode. In this situation, the polysilicon (metal, or other conductive material) is used not only to form gate electrode but also to form interconnect. More particularly, the gate electrode is extended to the targeted drain (or source) region and directly lands on the targeted drain (or source) region. In another example, the butted contacts 114 are elongated contacts oriented in the y direction and are formed simultaneously with other contacts (such as long contacts) in a same procedure that includes dielectric deposition, patterning and metal deposition.

Still referring to FIG. 2, some of the active regions 106 may have different dimensions (e.g., along the x direction, or the widthwise direction) from other active regions 106 due to channel tuning considerations. A channel (or transistor channel) refers to a portion of the active region directly under a gate 108. The channel widths of different transistors may be tuned differently to optimize operations related to cell stability, sink current, and access speed. For example, as shown, the active regions 106 for the pull-down and pass-gate transistors may be wider than the active regions for the pull-up transistors along the x direction. In other embodiments (not shown), instead of wider active regions, multiple active regions placed next to each other may be used for a single transistor.

Figure 3:
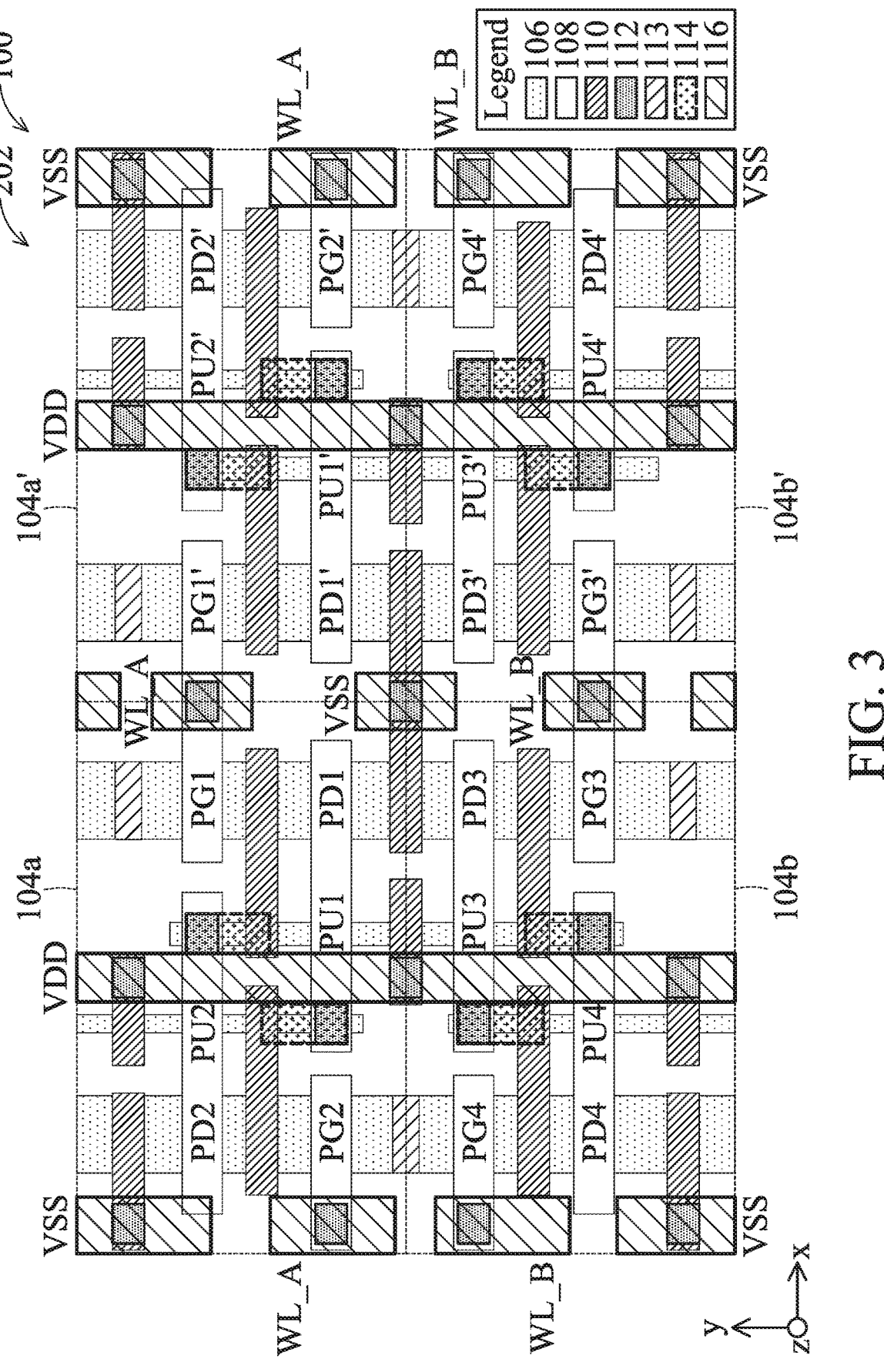
FIG. 3 illustrates a top view device layout showing frontside metal lines of the semiconductor device in FIG. 1 according to an embodiment of the present disclosure.

FIG. 3 illustrates further structures of the device layout 202 of FIG. 2. For example, FIG. 3 additionally shows several frontside metal lines 116 according to an embodiment of the present disclosure. The frontside metal lines 116 are disposed above the structures illustrated in FIG. 2 in a positive z direction, particularly above the frontside vias 112. These include the metal lines for the nodes WL_A, WL_B, VSS, and VDD, each of which are coupled to the corresponding frontside vias 112 discussed with reference to FIG. 2. As shown, some of the frontside metal lines 116 may span across several frontside vias 112 that connect to the same node (e.g., the metal lines VDD).

Figure 4:
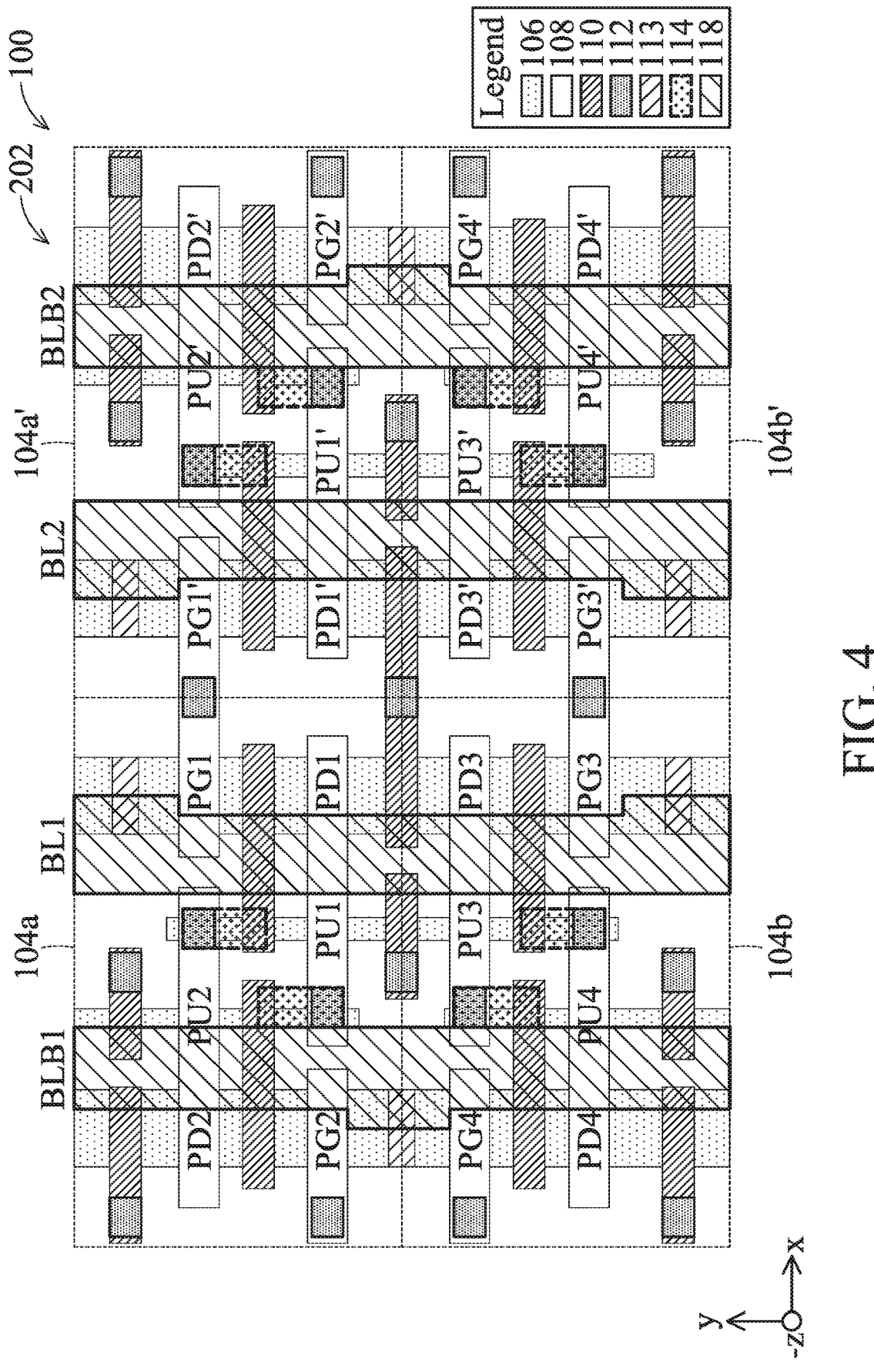
FIG. 4 illustrates a top view device layout showing backside metal lines of the semiconductor device in FIG. 1 according to an embodiment of the present disclosure.

FIG. 4 illustrates further structures of the device layout 202 of FIG. 2. For example, FIG. 4 additionally shows several backside metal lines 118 according to an embodiment of the present disclosure. The backside metal lines 118 are disposed below the device layout 202 in a negative z direction. These include the metal lines for the nodes BLB1, BL1, BL2, and BLB2, each of which are coupled to the corresponding backside vias 113 discussed with reference to FIG. 2. As shown, some of the backside metal lines 118 may span across several backside vias 113 that connect to the same node (e.g., the metal lines BL1 and BL2).

Figure 5:
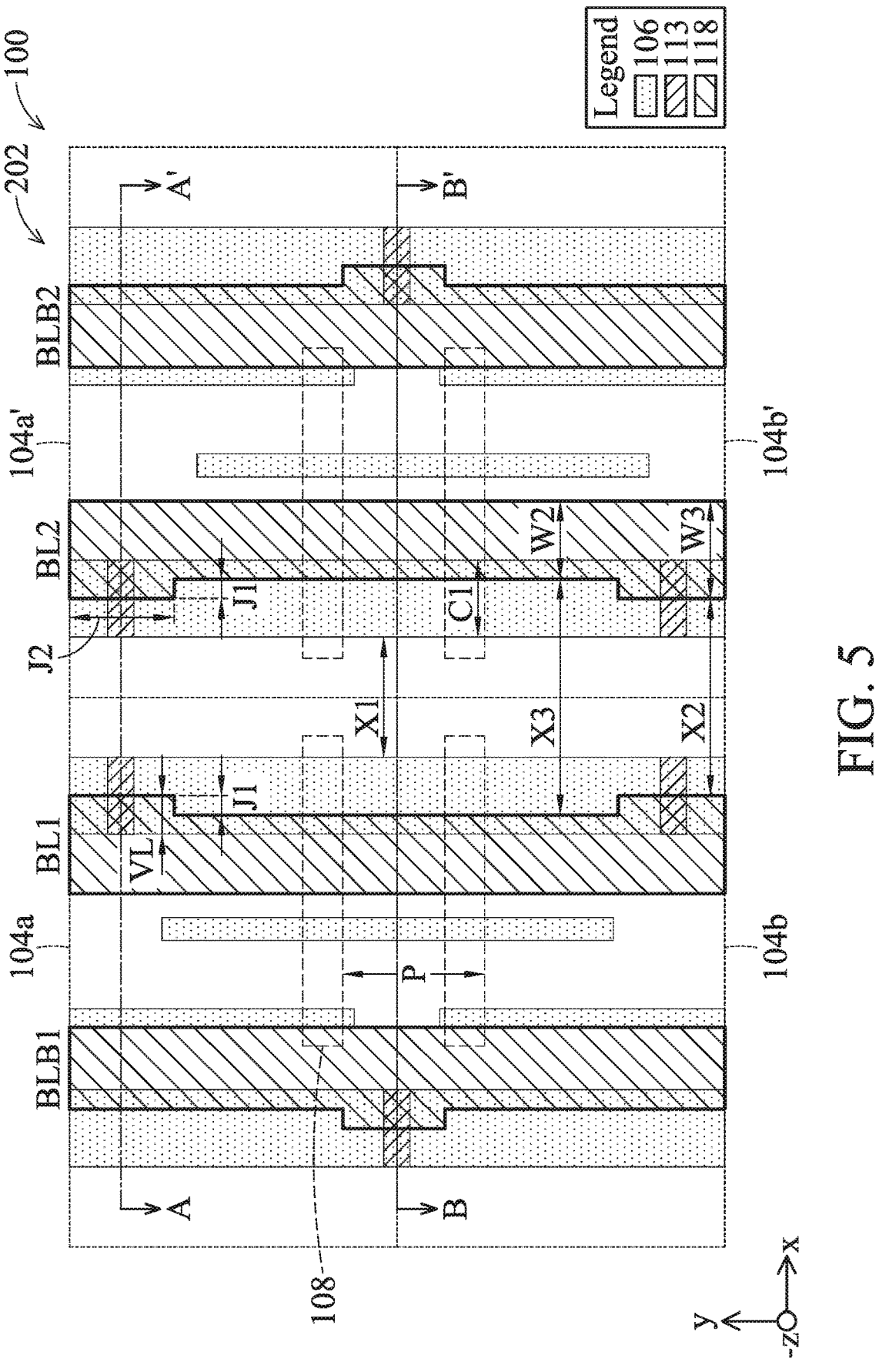
FIG. 5 illustrates a filtered top view device layout showing backside metal lines of the semiconductor device in FIG. 1 according to an embodiment of the present disclosure.

FIG. 5 also illustrates the device layout 202 according to an embodiment of the present disclosure, except that certain features are omitted for the ease of describing pertinent features of the metal lines for the nodes BLB1, BL1, BL2, and BLB2. Further, for ease of description, metal lines 118 for the nodes BLB1, BL1, BL2, and BLB2 are referred to as BLB1 metal line, BL1 metal line, BL2 metal line, and BLB2 metal line, respectively; and backside vias 113 for the nodes BLB1, BL1, BL2, and BLB2 are referred to as BLB1 via, BL1 vias, BL2 vias, and BLB2 via, respectively. As shown, the BL1 metal line and BLB1 metal line are the bit lines and bit line bars for SRAM cells 104a and 104b. And the BL2 metal line and BLB2 metal line are the bit lines and bit line bars for SRAM cells 104a' and 104b'. The BL1, BL2, BLB1, and BLB2 metal lines partially land on their respective backside vias 113. That is, each of the BL1, BL2, BLB1, and BLB2 vias only partially overlaps and makes direct contact with their respective metal lines. In an embodiment, the overlapped region between the backside vias 113 and the backside metal lines 118 may have a length VL, where VL is about half the total length of the respective backside via 113 in the x direction. The part of the backside vias 113 not covered by a metal line may be covered by a dielectric material, such as a material having silicon dioxide. Further, the BL1, BL2, BLB1, and BLB2 metal lines have jog offsets that cause the metal lines to have wider portions and narrower portions. The wider portions land on the backside vias 113.

FIG. 5 shows a spacing between two adjacent BL1 and BL2 metal lines across a vertical cell boundary that separates SRAM cells 104a and 104b from SRAM cells 104a' and 104b'. The dimensions and spacings related to the BL1 and BL2 metal lines may be described in reference to a channel width C1. The channel width C1 refers to the dimension along the x direction of a channel region under a gate 108 (shown by the dashed boxes). In this embodiment, the channel region refers to the channel region under the gate 108 of the active regions 106 for pull-down and pass-gate transistors. In some embodiments, the backside vias 113 may span a dimension along the x direction about equal to the channel width C1.

Each of the BL1 and BL2 metal lines have two wider portions and one narrower portion. Each of the two wider portions lands on a respective backside via 113. The wider portions have a width W3 along the x direction and the narrower portions have a width W2 along the x direction. The width W3 is in a range between 0.4 to 1.1 of the channel width C1. And the width W2 is in a range between 0.2 to 0.6 of the channel width C1. The wider portions and narrower portion of the BL2 metal line are aligned or substantially aligned on one side ("aligned side") along the y direction. On the other side ("unaligned side"), the wider and narrower portions are unaligned along the y direction such that the wider portions extend past the narrower portions by a jog offset J1. The difference in width between the wider and narrower portions corresponds to the jog offset J1. Similarly, each of the BL1, BLB1, and BLB2 metal lines has an aligned side and an unaligned side. Particularly, the BL1 metal line has a structure similar to the BL2 metal line and is about mirrored with the BL2 metal line with respect to the vertical cell boundary. The jog offset J1 is in a range between 0.2 to 0.5 of the channel width C1. If the jog offset J1 is too small, the capacitance reducing effect between narrower portions of adjacent bit lines would not be realized. If the jog offset J1 is too big while the width W3 remains constant, the resistance of the signal lines may be adversely affected due to having smaller metal bit lines. If the jog offset J1 is too big and the width W3 is increased to accommodate for metal volume, there may be adverse capacitive coupling between signal lines within the same SRAM cell (e.g., BL2 and BLB2). As such, a ratio between the width W2 to the jog offset J1 is in a range between 0.4 to 3, and a ratio between the width W3 to the jog offset J1 is in a range between 0.8 to 5.5. These ratios allow for the reduction of capacitive coupling between adjacent signal lines of different SRAM cells without adversely affecting other device performance parameters.

Still referring to FIG. 5, the unaligned sides of the BL1 and BL2 metal lines face each other. The BL1 and BL2 metal lines may form a shape depicting an opening bracket and a closing bracket. Further, the aligned sides of the BL1 and BL2 metal lines face the aligned sides of the BLB1 and BLB2 metal lines, respectively.

Still referring to FIG. 5, the distance X3 between the narrower portions of the BL1 and BL2 metal lines is greater than the distance X2 between the wider portions of the BL1 and BL2 metal lines along the x direction. The distance X2 is about equal to a distance X1 plus the channel width C1, where X1 is a distance between adjacent active regions 106 across the vertical cell boundary between SRAM cells (along the x direction). The distance X3 is about equal to the distance X2 plus two times the jog offset J1. Therefore, the difference between X3 and X2 is about equal to two times the jog offset J1. The jog offsets J1 is what allows for a greater spacing between the narrower portions of the BL1 and BL2 metal lines (as compared to the spacing between the wider portions of the BL1 and BL2 metal lines). This greater spacing reduces capacitive coupling and is available because the narrower portions of the BL1 and BL2 metal lines do not land on the backside vias 113. The distance X2 is also significant since it is greater than just a spacing between adjacent active regions 106, allowing for additional reduction in capacitive coupling. This is because each of the BL1 and BL2 metal lines only partially land on their respective backside vias 113. For example, these metal lines only land on half of the backside vias 113, which enables an extra spacing equaling the channel width C1.

Still referring to FIG. 5, along the y direction, the length of each of the narrower portions of the BL1 and BL2 metal lines is greater than the length of each of the wider portions of the BL1 and BL2 metal lines. The length of each of the wider portions is defined by a jog length J2. The jog length J2 is about equal to a range between half of a pitch P to a pitch P, where P is the pitch between gates 108 in the y direction. The range for the jog length J2 allows for maximized narrower portions to reduce coupling capacitance, and at the same time to ensure proper landing onto the backside vias 113 when considering landing margins.

Figure 6:
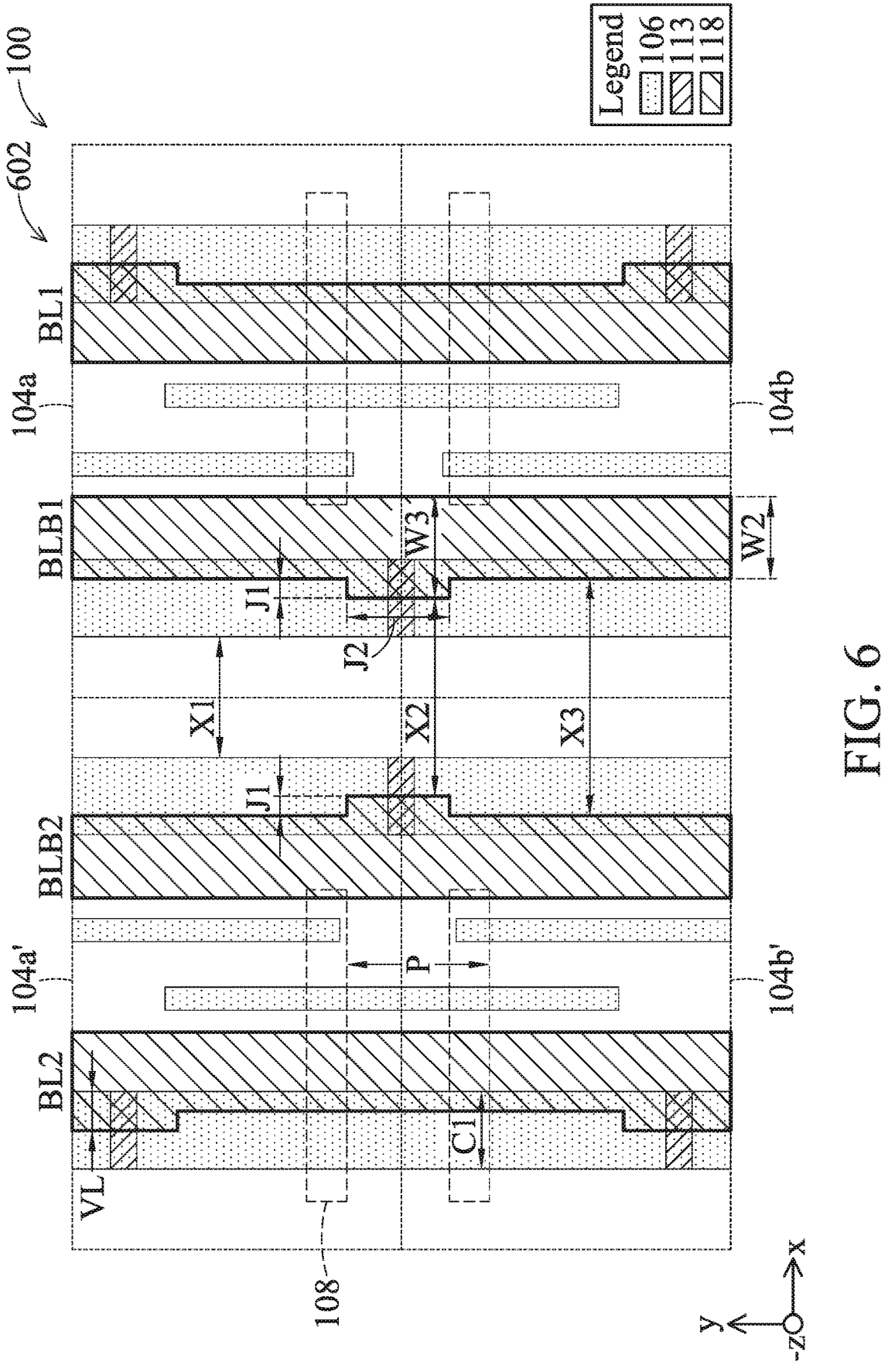
FIG. 6 illustrates yet another top view device layout showing backside metal lines of the semiconductor device in FIG. 1 according to an embodiment of the present disclosure.

FIG. 6 illustrates another top view device layout 602 of the SRAM array 102 in FIG. 1, except that the cell positions are rearranged. In that regard, when compared to the device layout 202 in FIG. 5, the locations of the SRAM cells 104a and 104b are swapped with the locations of the SRAM cells 104a' and 104b'. Instead of two adjacent BL1 and BL2 metal lines disposed across a vertical cell boundary, device layout 602 shows two adjacent BLB2 and BLB1 metal lines disposed across a vertical cell boundary. Similar to FIG. 5, the dimensions and spacings related to the BLB2 and BLB1 metal lines may be described in reference to a channel width C1. The channel width C1 refers to the dimension along the x direction of a channel region under a gate 108 (shown by the dashed boxes). In this embodiment, the channel region refers to the channel region under the gate 108 of the active regions 106 for pull-down and pass-gate transistors. Each of the BLB2 and BLB1 metal lines have two narrower portions and one wider portion. Each of the wider portions lands on the respective backside via 113. The wider portions have a width W3 along the x direction and the narrower portions have a width W2 along the x direction. The width W3 is in a range between 0.4 to 1.1 of the channel width C1. And the width W2 is in a range between 0.2 to 0.6 of the channel width C1. The wider portion and narrower portions of the BLB1 metal line are aligned or substantially aligned on one side ("aligned side") along the y direction. On the other side ("unaligned side"), the wider and narrower portions are unaligned along the y direction such that the wider portion extends past the narrower portions by a jog offset J1. The difference in width between the wider and narrower portions corresponds to the jog offset J1. Similarly, each of the BL1, BL2, and BLB2 metal lines has an aligned side and an unaligned side. Particularly, the BLB2 metal line has a structure similar to the BLB1 metal line and is about mirrored with the BLB1 metal line with respect to the vertical cell boundary. For similar reasons as for the device layout 202 in FIG. 5, the jog offset J1 is in a range between 0.2 to 0.5 of the channel width C1. As such, a ratio between the width W2 to the jog offset J1 is in a range between 0.4 to 3, and a ratio between the width W3 to the jog offset J1 is in a range between 0.8 to 5.5.

Still referring to FIG. 6, the unaligned sides of the BLB1 and BLB2 metal lines face each other. The BLB1 and BLB2 metal lines may form a shape depicting an hourglass in a space in between, narrow in the middle and wide on the ends. Further, the aligned sides of the BLB1 and BLB2 metal lines face the aligned sides of the BL1 and BL2 metal lines, respectively.

Still referring to FIG. 6, the distance X3 between the narrower portions of the BLB2 and BLB1 metal lines is greater than the distance X2 between the wider portions of the BLB2 and BLB1 metal lines along the x direction. The distance X2 is about equal to a distance X1 plus the channel width C1, where X1 is a distance between adjacent active regions 106 across the vertical cell boundary between SRAM cells (along the x direction). The distance X3 is about equal to the distance X2 plus two times the jog offset J1. Therefore, the difference in distance between X3 and X2 is about equal to two times the jog offset J1. The jog offsets J1 is what allows for a greater spacing between the narrower portions of the BLB1 and BLB2 metal lines (as compared to the spacing between the wider portions of the BLB1 and BLB2 metal lines). This greater spacing reduces capacitive coupling and is available because the narrower portions of the BLB1 and BLB2 metal lines do not land on the backside vias 113. The distance X2 is also significant since it is greater than just a spacing between adjacent active regions 106, allowing for additional reduction in capacitive coupling. This is because each of the BLB1 and BLB2 metal lines only partially land on their respective backside vias 113. For example, these metal lines only land on half of the backside vias 113, which enables an extra spacing equaling the channel width C1.

Still referring to FIG. 6, along the y direction, the length of each of the narrower portions of the metal lines BLB2 and BLB1 is greater than the length of each of the wider portions of the metal lines BLB2 and BLB1. The length of each of the wider portions is defined by a jog length J2. The jog length J2 is about equal to a range between half of a pitch P to a pitch P, where P is the pitch between gates 108 in the y direction.

Figure 7:
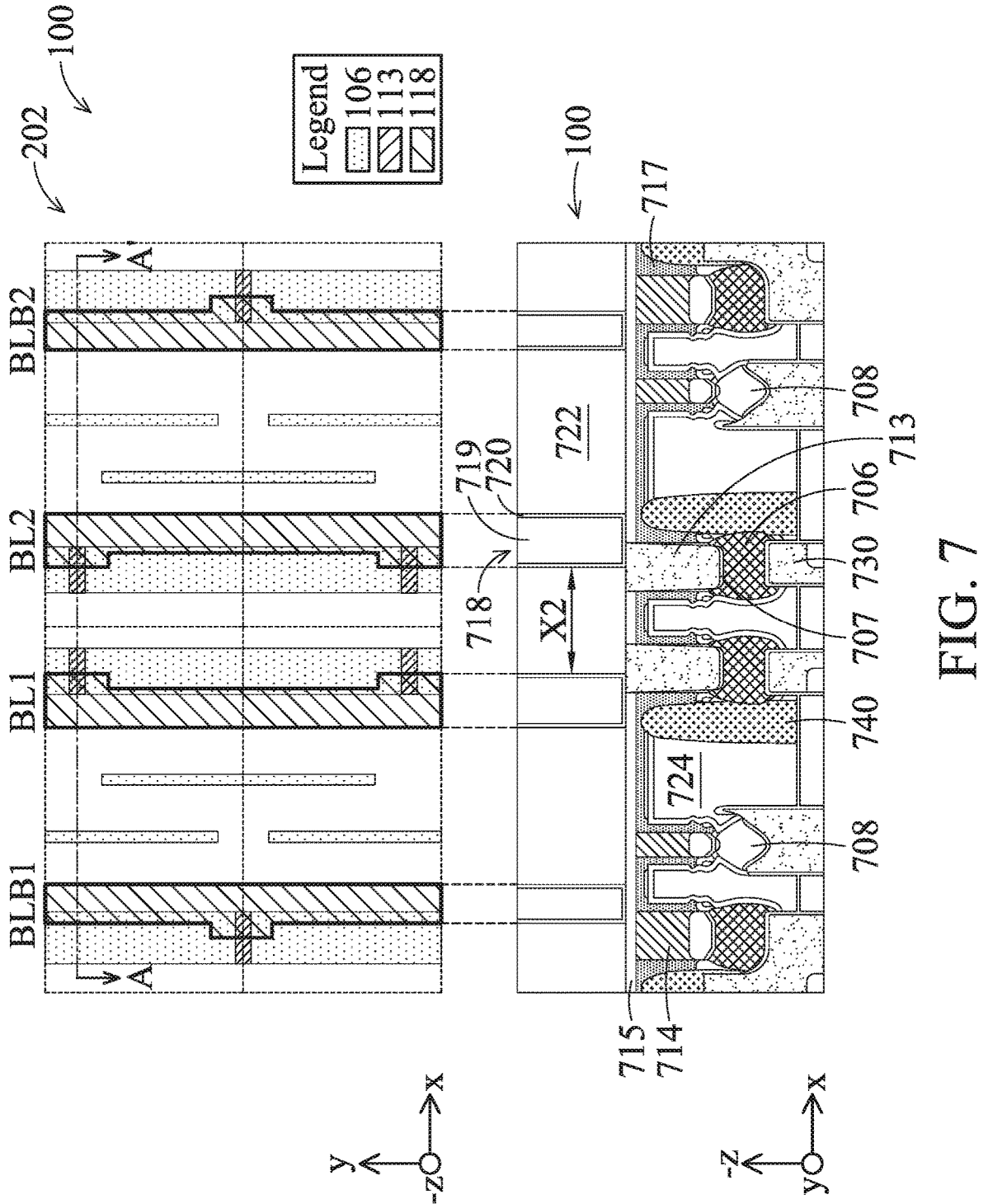
FIG. 7 illustrates a top view and a cross-sectional view of a semiconductor device having an SRAM array cut along the lines A-A'.

FIG. 7 illustrates a side-by-side view of the device layout 202 (top) and a cross-sectional view of the device 100 (bottom), cut along the line A-A'. The A-A' line cuts through the wider portions of the BL1 and BL2 metal lines and through their corresponding backside vias 113. The A-A' line also cuts along the narrower portions of the BLB1 and BLB2 metal lines. In this view, the widths of each of the BLB1, BL1, BL2, and BLB2 metal lines correspond to and are substantially equal to the widths of each of the backside metal lines 718, as shown by the dashed vertical lines.

In an embodiment, the backside metal lines 718 may include a barrier layer 720 and a metal fill layer 719 over the barrier layer 720. The barrier layer 720 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer 719 may include copper (Cu), tungsten (W), cobalt (Co), molybdenum (Mo), ruthenium (Ru), or other metals, and may be formed by CVD, PVD, ALD, plating, or other suitable processes. In some embodiments, the barrier layer 720 is omitted in backside metal lines 718.

As shown, the distance between the wider portions of BL1 and BL2 metal lines is X2, and each of the wider portions of BL1 and BL2 metal lines partially lands on a backside via 713. The backside vias 713 may correspond to the backside vias 113 in the device layout 202. As shown, the distance X2 is greater than a distance between the adjacent backside vias 713. Parts of the backside vias 713 are not covered by the backside metal lines 718, and they are instead covered by a backside dielectric layer 722. The backside metal lines 718 are generally thicker in the z direction than the frontside metal lines 116 (not explicitly shown). For example, the backside metal lines 718 (or 118) may be twice as thick as the frontside metal lines 116 so that the increased thickness of the backside metal lines 718 may compensate for any adverse resistance effects due to decreased surface contact area with the backside vias 713. The backside vias 713 further couple to source/drain (S/D) epitaxial features 706, which may then couple to conductive features 730 on a front side of the device 100. In an embodiment, the S/D epitaxial features 706 are doped with n-type dopants for n-type transistors. In some embodiments, the S/D epitaxial features 706 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). Further, in some embodiments, there may be silicide features 707 disposed over and under the S/D epitaxial features 706. For example, the silicide features 707 may be disposed between the S/D epitaxial features 706 and the backside vias 713. The silicide features 707 may also be disposed between the S/D epitaxial features 706 and the conductive features 730. The silicide features 707 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

As shown, the device 100 also includes S/D epitaxial features 708. In an embodiment, the S/D epitaxial features 708 are doped with p-type dopants for p-type transistors. In some embodiments, for p-type transistors, the S/D epitaxial features 708 include silicon germanium or germanium and can be doped with boron, other p-type dopant, or combinations thereof (for example, forming Si:Ge:B epitaxial source/drain features). In an embodiment, the S/D epitaxial features 708 do not couple to the backside vias 713, and only couple to the conductive features 730 on the front side of the device 100. The silicide features 707 may also be disposed between the S/D epitaxial features 708 and the conductive features 730. As shown, the S/D epitaxial features 708 may be smaller than the epitaxial features 706 due to the dimension of the underlying active regions 106. The S/D epitaxial features 706 and 708 are isolated from each other by an interlayer dielectric (ILD) layer 724. In some embodiments, the ILD layer 724 may embed a shallow trench isolation layer (STI) at a bottom portion of the ILD layer (not shown).

Still referring to FIG. 7, each of the narrower portions of the BLB1 and BLB2 metal lines do not land on the backside vias 713. Instead, they land on a contact etch stop layer (CESL) 715. The CESL 715 includes a material that is different than the backside dielectric layer 722 and different than the ILD layer 724. The CESL 715 may include La$_2$O$_3$, Al$_2$O$_3$, SiOCN, SiOC, SiCN, SiO$_2$, SiC, ZnO, ZrN, Zr$_2$Al$_3$O$_9$, TiO$_2$, TaO$_2$, ZrO$_2$, HfO$_2$, Si$_3$N$_4$, Y$_2$O$_3$, AlON, TaCN, ZrSi, or other suitable material(s); and may be formed by CVD, PVD, ALD, or other suitable methods. The backside dielectric layer 722 and the ILD layer 724 may comprise oxide formed with tetraethylorthosilicate, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. For S/D epitaxial features 706 and S/D epitaxial features 708 that do not couple to a backside via 713, an insulating layer 714 is disposed over them, which then contacts the CESL 715. The insulating layer 714 may include materials similar to that of the backside dielectric layer 722. In some embodiments, there may be a dielectric liner 717 that lines the sidewalls of the backside vias 713 and the insulating layer 714. In some embodiments, cut metal gate features 740 may be disposed within the ILD layer 724. The cut metal gate features 740 may separate and isolate gate structures in the semiconductor device 100. The cut metal gate features 740 may be formed by a cut metal gate process. This process may include cutting gate structures along the y direction to form trenches, and then filling the trenches with a dielectric material. Each separated gate structure functions as a metal gate for different transistors. In some embodiments, portions of the cut metal gate features are directly below the BL1 and BL2 metal lines, and they span a vertical distance of the ILD layer 724.

Figure 8:
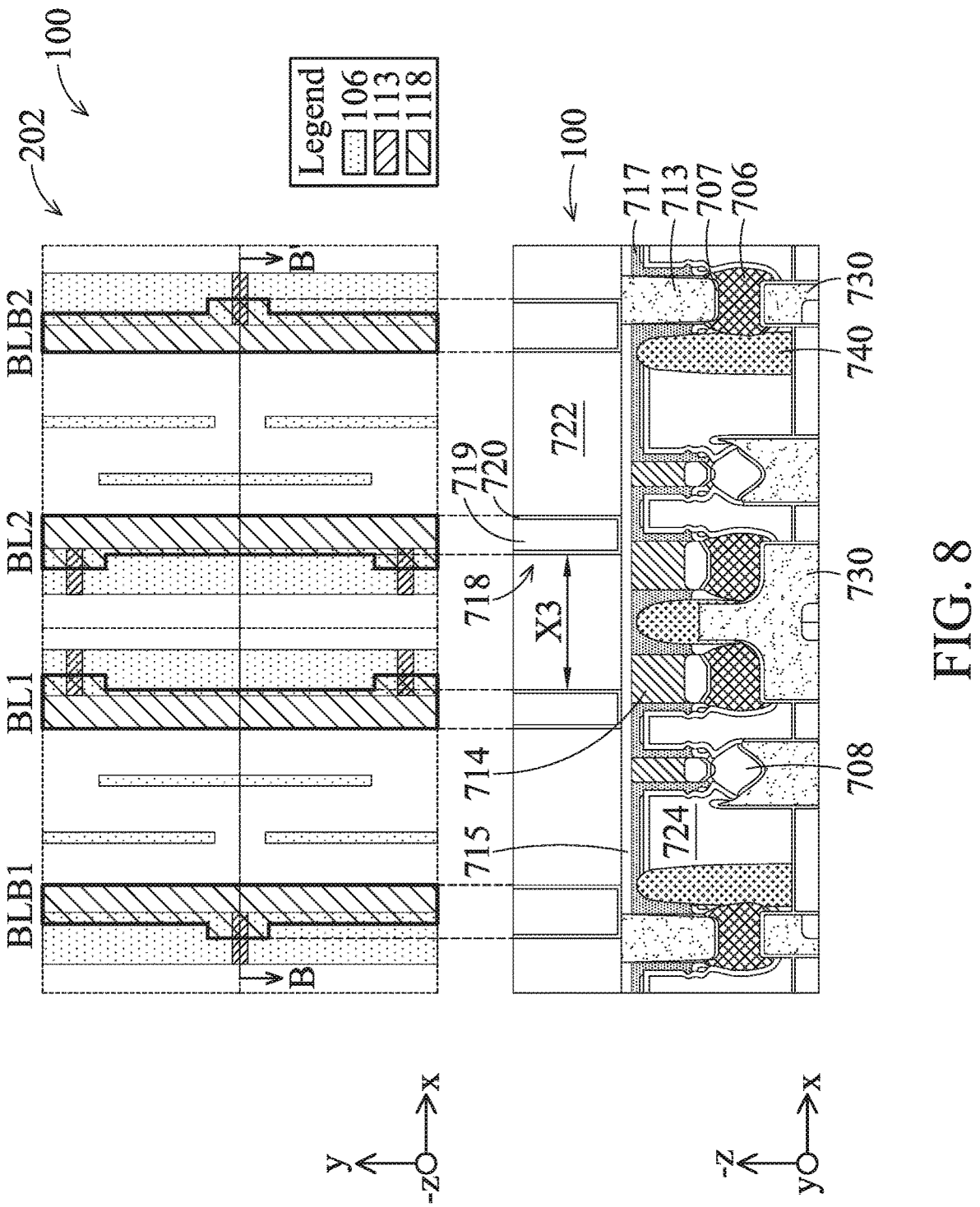
FIG. 8 illustrates a top view and a cross-sectional view of a semiconductor device having an SRAM array cut along the lines B-B'.

FIG. 8 illustrates a side-by-side view of the device layout 202 (top) and a cross-sectional view of the device 100 (bottom), cut along the line B-B'. The B-B' line cuts through the narrower portions of the BL1 and BL2 metal lines and the wider portions of the BLB1 and BLB2 metal lines. In this view, the widths of each of the BLB1, BL1, BL2, and BLB2 metal lines correspond to and are substantially equal to the widths of each of the backside metal lines 718 as shown by the dashed vertical lines. The labeled features in FIG. 8 are the same as the ones shown in FIG. 7. With respect to FIG. 8, the description of some of these features are omitted for the sake of brevity.

As shown, the distance between the narrower portions of BL1 and BL2 is X3. Each of the narrower portions do not land on any backside via 713. Because the backside metal lines 718 (or 118) are generally thicker in the z direction than the frontside metal lines 116 (not explicitly shown), having a smaller width in the narrower portions of the backside metal lines 718 is generally acceptable because it does not increase resistance compared to a wider but thinner metal line (such as frontside metal lines 116). For example, the backside metal lines 718 may be twice as thick as the frontside metal lines 116 so that the increased thickness of the backside metal lines 718 may compensate for any adverse resistance effects due to a decreased width. Further, since the narrower portions of the backside metal lines 718 do not contact the backside vias 713, they can have a reduced width as compared to the wider portions of the backside metal lines 718 that do contact the backside vias 713. In this cross-sectional view, the S/D epitaxial features 706 under the narrower portions of BL1 and BL2 couple to a shared conductive feature 730, which may correspond to a ground voltage node VSS (See FIG. 3). In one embodiment, the distance X3 between the narrower portions of BL1 and BL2 is greater than the width of the shared conductive feature 730. The wider portions of metal lines BLB1 and BLB2 are configured similarly to the wider portions of metal lines BL1 and BL2 as shown in FIG. 7.

Figure 9:
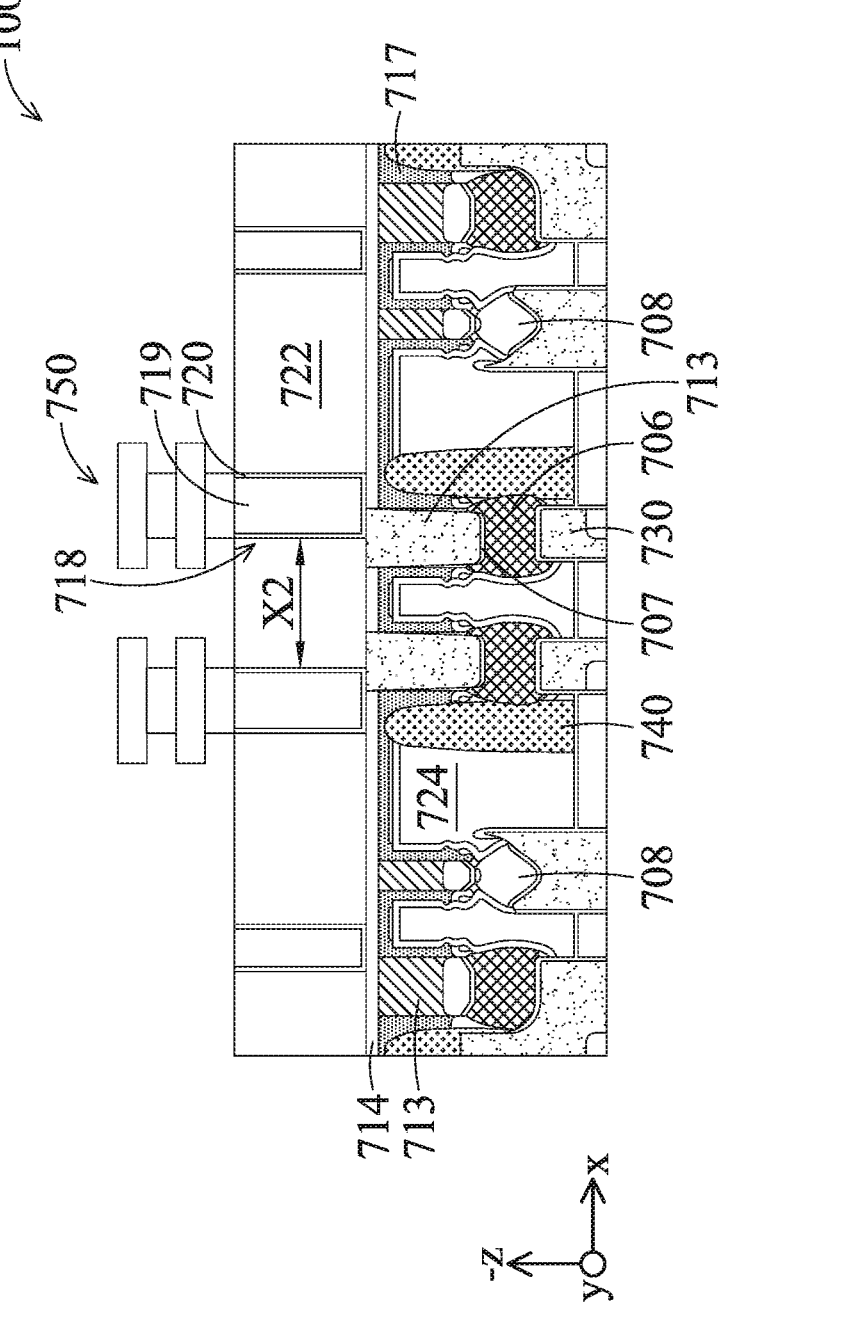
FIG. 9 illustrates a cross-sectional view showing backside interconnects of a semiconductor device according to an embodiment of the present disclosure.

FIG. 9 illustrates a cross-sectional view showing backside interconnects 750 of the SRAM device 100, according to an embodiment of the present disclosure. As shown, the device 100 may further include a backside interconnect 750 over one or more of the backside metal lines 718 and the backside dielectric layer 722. Although not shown in FIG. 9, the backside interconnect 750 includes wires and vias embedded in one or more dielectric layers. Having the backside metal lines 718 connected to the backside interconnect 750 beneficially increases the number of metal tracks available in the device 100 for directly connecting to source/drain contacts and vias. It also increases the gate density for greater device integration than other structures without the backside metal connections.

Although not limiting, the present disclosure offers advantages for semiconductor devices having embedded SRAM. One example advantage is that the widths of certain portions of backside bit lines may be reduced without adversely affecting resistance. This is because the backside metal lines can have a greater thickness than if they were on the front side. The reduced width may allow for more optimized spacing between adjacent bit lines or bit line bars, which advantageously reduces parasitic capacitance. Another example advantage is that adjacent bit lines and bit line bars partially land on the backside vias. This allows for more space between the adjacent bit lines and bit line bars. Another example advantage is to have a jog offset that allows for further spacing between the adjacent metal lines. These spacing and dimension features allow for SRAM speed improvement by reducing the coupling capacitance between the adjacent bit lines and bit line bars between SRAM cells.

One aspect of the present disclosure pertains to a semiconductor device. The device includes a first source/drain feature on a front side of a substrate. The device includes a first backside metal line under the first source/drain feature and extending lengthwise along a first direction. The device includes a first backside via disposed between the first source/drain feature and the first backside metal line. The first backside metal line is a first bit line of a first static random access memory (SRAM) cell and is connected to the first source/drain feature through the first backside via. The first backside metal line includes a first portion and a second portion each extending widthwise along a second direction perpendicular to the first direction, the first portion is wider than the second portion, and the first portion partially lands on the first backside via. The first and the second portions are substantially aligned on one side along the first direction.

In an embodiment of the semiconductor device, a bottom surface of the first backside via directly contacts and is partially covered by a dielectric layer. In another embodiment, the semiconductor device further includes multiple gate structures engaging transistor channels of the first SRAM cell and extending along the second direction, each of the transistor channels having a channel width along the second direction. And a difference in width between the first and the second portions is in a range between 0.2 to 0.5 of the channel width.

In an embodiment of the semiconductor device, along the first direction, a length of the second portion is greater than a length of the first portion. In another embodiment of the semiconductor device, the gate structures have a first pitch along the first direction, and the length of the first portion is in a range between half of the first pitch and the first pitch.

In an embodiment, the semiconductor device further includes a second source/drain feature on the front side of the substrate, the second source/drain feature being part of a second SRAM cell adjacent to the first SRAM cell. The device includes a second backside metal line under the second source/drain feature and extending lengthwise along the first direction. And the device includes a second backside via disposed between the second active region and the second backside metal line. The second backside metal line is a second bit line of the second SRAM cell and is connected to the second source/drain feature through the second backside via. The second backside metal line includes a third portion and a fourth portion each extending widthwise along the second direction, the third portion is wider than the fourth portion, and the third portion partially lands on the second backside via. And the third and the fourth portions are substantially aligned on one side along the first direction.

In an embodiment of the semiconductor device, a first distance between the second portion and the fourth portion is greater than a second distance between the first portion and the third portion. In another embodiment of the semiconductor device, the second distance is about equal to a distance between the first and second active regions along the second direction plus the channel width. In yet another embodiment of the semiconductor device, the first distance is less than the second distance plus the channel width.

Another aspect of the present disclosure pertains to a device. The device includes multiple active regions extending lengthwise along a first direction on a front side of a substrate. The active regions include a first active region and a second active region, the first and second active regions being part of at least two adjacent static random access memory (SRAM) cells. The device includes multiple gate structures engaging channel regions of the active regions and extending along a second direction perpendicular to the first direction, each of the channel regions having a channel width along the second direction. The device includes backside metal lines under the active regions and extending lengthwise along the first direction, the backside metal lines having bit lines and bit line bars, the bit lines including a first bit line and a second bit line. The device includes two first backside vias and two second backside vias, where the first bit line is connected to the first active region through the first backside vias and the second bit line is connected to the second active region through the second backside vias. The first bit line includes two first portions and one second portion each extending widthwise along the second direction, each of the first portions is wider than the second portion, and the two first portions partially land on the two first backside vias, respectively. The second bit line includes two third portions and one fourth portion each extending widthwise along the second direction, each of the two third portions is wider than the fourth portion, and the two third portions partially land on the two second backside vias, respectively. The two first portions directly oppose the two third portions, respectively. A first distance between the second portion and the fourth portion is greater than a second distance between each of the two first portions and the respective opposing third portions.

In an embodiment of the device, bottom surfaces of each of the first and the second backside vias is partially covered by a dielectric layer. In another embodiment of the device, the second distance is about equal to a distance between the first and second active regions plus the channel width.

In an embodiment of the device, the first distance is less than the second distance plus the channel width. In another embodiment of the device, the two first portions and the second portion is substantially aligned on one side along the first direction, each of the two first portions extends past the second portion along the second direction by a jog offset, and the jog offset is in a range between 0.2 to 0.5 of the channel width.

In an embodiment of the device, the second and the fourth portions each have a width in a range between 0.2 to 0.6 of the channel width. In another embodiment of the device, the first and the third portions each have a width in a range between 0.4 to 1.1 of the channel width.

Another aspect of the present disclosure pertains to a device. The device includes first and second static random access memory (SRAM) cells adjacent each other, each of the first and the second SRAM cells having: a gate structure engaging a transistor channel, the gate structure extending along a first direction, and the transistor channel having a channel width along the first direction; a source/drain (S/D) feature; and a backside vias in contact with the S/D feature. The device includes an interlayer dielectric (ILD) layer surrounding the S/D features of the first and the second SRAM cells and isolating them from each other. The device includes cut metal gate features embedded in the ILD layer and separating the gate structures of the first and the second SRAM cells from other gate structures of the first and the second SRAM cells. The device includes frontside metal lines over a front side of the ILD layer. The device includes backside metal lines under a back side of the ILD layer, the backside metal lines including a first bit line connected to the backside via of the first SRAM cell and a second bit line connected to the backside via of the second SRAM cell, each of the first and the second bit lines extending lengthwise along a second direction perpendicular to the first direction. The first bit line includes a first portion and a second portion each extending widthwise along the first direction, and the first portion is wider than the second portion. The second bit line includes a third portion and a fourth portion each extending widthwise along the first direction, and the third portion is wider than the fourth portion. And each of the first and the second bit lines are directly over one of the first and second backside vias and directly over one of the cut metal gate features.

In an embodiment of the device, along the second direction, the first portion extends past the second portion by a jog offset and the third portion extends past the fourth portion by the jog offset, where the jog offset is in a range between 0.2 to 0.5 of the channel width. In another embodiment of the device, a ratio between a width of the first portion to the jog offset and a width of the third portion to the jog offset is in a range between 0.8 to 5.5. In yet another embodiment of the device, a ratio between a width of the second portion to the jog offset and a width of the fourth portion to the jog offset is in a range between 0.4 to 3.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a first source/drain feature;
a gate structure engaging a transistor channel adjacent the first source/drain feature, the gate structure disposed above and on a front side of the transistor channel;
a first backside metal line under and on a back side of the first source/drain feature, the first backside metal line extending lengthwise along a first direction; and

a first backside via disposed between the first source/drain feature and the first backside metal line,
wherein the first backside metal line is a first bit line of a first static random access memory (SRAM) cell and is connected to the first source/drain feature through the first backside via,
wherein the first backside metal line includes a first portion and a second portion each extending widthwise along a second direction perpendicular to the first direction, the first portion is wider than the second portion, and the first portion partially lands on the first backside via,
wherein the first and the second portions are substantially aligned on one side along the first direction.

2. The semiconductor device of claim 1, wherein a bottom surface of the first backside via directly contacts and is partially covered by a dielectric layer.

3. The semiconductor device of claim 1,
wherein the gate structure is one of multiple gate structures engaging transistor channels of the first SRAM cell and extending along the second direction, each of the transistor channels having a channel width along the second direction,
wherein a difference in width between the first and the second portions is in a range between 0.2 to 0.5 of the channel width.

4. The semiconductor device of claim 3, wherein along the first direction, a length of the second portion is greater than a length of the first portion.

5. The semiconductor device of claim 4, wherein the gate structures have a first pitch along the first direction, and the length of the first portion is in a range between half of the first pitch and the first pitch.

6. The semiconductor device of claim 3, further comprising:
a second source/drain feature, the second source/drain feature being part of a second SRAM cell adjacent to the first SRAM cell;
a second backside metal line under the second source/drain feature and extending lengthwise along the first direction; and
a second backside via disposed between the second source/drain feature and the second backside metal line,
wherein the second backside metal line is a second bit line of the second SRAM cell and is connected to the second source/drain feature through the second backside via,
wherein the second backside metal line includes a third portion and a fourth portion each extending widthwise along the second direction, the third portion is wider than the fourth portion, and the third portion partially lands on the second backside via,
wherein the third and the fourth portions are substantially aligned on one side along the first direction.

7. The semiconductor device of claim 6, wherein a first distance between the second portion and the fourth portion is greater than a second distance between the first portion and the third portion.

8. The semiconductor device of claim 7, wherein the second distance is about equal to a distance between the first and second source/drain features along the second direction plus the channel width.

9. The semiconductor device of claim 8, wherein the first distance is less than the second distance plus the channel width.

10. A device, comprising:

multiple active regions extending lengthwise along a first direction on a front side of a substrate, the active regions including a first active region and a second active region, the first and second active regions being part of at least two adjacent static random access memory (SRAM) cells;

multiple gate structures engaging channel regions of the active regions, the multiple gate structures disposed on the front side of the substrate and extending along a second direction perpendicular to the first direction, each of the channel regions having a channel width along the second direction;

backside metal lines disposed on a back side of the substrate under the active regions and extending lengthwise along the first direction, the backside metal lines having bit lines and bit line bars, the bit lines including a first bit line and a second bit line;

two first backside vias; and two second backside vias, wherein the first bit line is connected to the first active region through the first backside vias and the second bit line is connected to the second active region through the second backside vias, wherein the first bit line includes two first portions and one second portion each extending widthwise along the second direction, each of the two first portions is wider than the second portion, and the two first portions partially land on the two first backside vias, respectively, wherein the second bit line includes two third portions and one fourth portion each extending widthwise along the second direction, each of the two third portions is wider than the fourth portion, and the two third portions partially land on the two second backside vias, respectively, wherein the two first portions directly oppose the two third portions, respectively, wherein a first distance between the second portion and the fourth portion is greater than a second distance between each of the two first portions and the respective opposing third portions.

11. The device of claim 10, wherein bottom surfaces of each of the two first and the two second backside vias is partially covered by a dielectric layer.

12. The device of claim 10, wherein the second distance is about equal to a distance between the first and second active regions plus the channel width.

13. The device of claim 12, wherein the first distance is less than the second distance plus the channel width.

14. The device of claim 13, wherein the two first portions and the second portion is substantially aligned on one side along the first direction, each of the two first portions extends past the second portion along the second direction by a jog offset, and the jog offset is in a range between 0.2 to 0.5 of the channel width.

15. The device of claim 13, wherein the second and the fourth portions each have a width in a range between 0.2 to 0.6 of the channel width.

16. The device of claim 13, wherein the two first and the two third portions each have a width in a range between 0.4 to 1.1 of the channel width.

17. A device, comprising:

first and second static random access memory (SRAM) cells adjacent each other, each of the first and the second SRAM cells having:

a gate structure engaging a transistor channel on a front side of the transistor channel, the gate structure extending along a first direction, and the transistor channel having a channel width along the first direction;

a source/drain (S/D) feature adjacent the transistor channel; and a backside via on a back side of and in contact with the S/D feature, wherein the front side and back sides are opposite sides of the device along a cross-sectional view;

an interlayer dielectric (ILD) layer surrounding the S/D features of the first and the second SRAM cells and isolating them from each other;

cut metal gate features embedded in the ILD layer and separating the gate structures of the first and the second SRAM cells from other gate structures of the first and the second SRAM cells;

frontside metal lines over a front side of the ILD layer; and backside metal lines under a back side of the ILD layer, the backside metal lines including a first bit line connected to the backside via of the first SRAM cell and a second bit line connected to the backside via of the second SRAM cell, each of the first and the second bit lines extending lengthwise along a second direction perpendicular to the first direction, wherein the first bit line includes a first portion and a second portion each extending widthwise along the first direction, and the first portion is wider than the second portion, wherein the second bit line includes a third portion and a fourth portion each extending widthwise along the first direction, and the third portion is wider than the fourth portion, wherein each of the first and the second bit lines are directly over one of the backside vias and directly over one of the cut metal gate features.

18. The device of claim 17, wherein along the second direction, the first portion extends past the second portion by a jog offset and the third portion extends past the fourth portion by the jog offset, wherein the jog offset is in a range between 0.2 to 0.5 of the channel width.

19. The device of claim 18, wherein a ratio between a width of the first portion to the jog offset and a width of the third portion to the jog offset is in a range between 0.8 to 5.5.

20. The device of claim 18, wherein a ratio between a width of the second portion to the jog offset and a width of the fourth portion to the jog offset is in a range between 0.4 to 3.

* * * * *